United States Patent [19]
Mohan et al.

[11] 3,889,136

[45] June 10, 1975

[54] SIGNAL STRIPPING CIRCUIT

[75] Inventors: William L. Mohan; Samuel P. Willits, both of Barrington, Ill.

[73] Assignee: Spartanics, Ltd., Rolling Meadows, Ill.

[22] Filed: June 29, 1973

[21] Appl. No.: 375,105

Related U.S. Application Data

[62] Division of Ser. No. 301,661, Nov. 2, 1972, abandoned, which is a division of Ser. No. 120,889, March 4, 1971, Pat. No. 3,790,759, which is a division of Ser. No. 780,367, Dec. 2, 1968, Pat. No. 3,581,067.

[52] U.S. Cl. ................. 307/295; 307/229; 328/138

[51] Int. Cl. ............................................. H03k 1/16

[58] Field of Search ........... 307/233, 229, 230, 295; 328/137, 138, 139, 114, 185, 167, 53, 29

[56] References Cited

UNITED STATES PATENTS

| | | | |
|---|---|---|---|
| 3,174,055 | 3/1965 | Clapper | 307/229 |
| 3,205,448 | 9/1965 | Bahrs et al. | 307/233 X |
| 3,548,323 | 12/1970 | Gordon et al. | 307/230 X |

*Primary Examiner*—Michael J. Lynch
*Assistant Examiner*—B. P. Davis
*Attorney, Agent, or Firm*—Jacque L. Meister

[57] ABSTRACT

A circuit having a high gain, diode clamped capacitive input operational amplifier for stripping the highest frequency above a preset threshold level present in a complex signal wavetrain having more than one frequency component. Threshold level is established by varying amplifier gain and/or selection of diodes with particular junction potentials. When amplifier output exceeds the junction potential, a diode conducts to maintain the charge on the input coupling capacitor in substantially matching relationship with the incoming waveform.

7 Claims, 19 Drawing Figures

SIGNAL STRIPPING CIRCUIT

CROSS REFERENCE TO RELATED APPLICATION

This is a division of application Ser. No. 301,661, filed Nov. 2, 1972, now abandoned; which is a division of Ser. No. 120,889, filed March 4, 1971, now U.S. Pat. No. 3,790,759; which is a division of Ser. No. 780,367, filed December 2, 1968 now U.S. Pat. No. 3,581,067.

BACKGROUND OF THE INVENTION

This invention relates generally to article counting apparatus and more particularly to sensing and indicating apparatus for counting a plurality of substantially identical objects stacked adjacent one another and either with or without spaces intervening between objects.

Many manufacturing and commercial processes result in stacks of finished or semi-finished materials which need to be counted to enable a segregation of a particular quantity for subsequent processing or sale. Additionally, ascertainment of the stacked quantity is often necessary for inventory or cost control purposes. However, counting of stacked material has often been very difficult where not impossible where using prior art counting devices because of the very low contrast gradients between adjacent pieces of the stacked materials.

Among the industries requiring a numerical segregation of or ascertainment of stacked materials having a low boundary contrast gradient, are those manufacturing or utilizing razor blades, envelopes, stacked papers and metals, fibre and corrugated boards, etc. With such materials the physical contrast properties of the boundaries between adjacent pieces when the material is tightly stacked, is very low, regardless of whether magnetic, electrical, electromagnetic, optical accoustic, fluidic, or other properties are considered. As a result, counting utilizing an appropriate sensor to detect these properties proves either impossible or impracticable because of the counting errors associated with ambiguities. Thus, until now, despite the obvious existence of the problem for many years, it was necessary to resort to weighting methods to obtain an approximate count of such stacked materials. Further, when a more exact count of the stacked material was required, it was customary to unstack the material at least temporarily, as by riffling. This increases boundary contrast, whereupon the unstacked material can be counted by conventional mechanical or electro-optical sensor-indicators.

Where objects to be counted are spaced apart, electro-optical devices for counting the objects are well known. Such devices are characterized by their dependence on the high contrast gradient realized with the spaced apart objects and the correspondingly high signal to noise ratios in the output signals of their sensor. With such prior art devices, as counting speeds increase and object spacing decreases, changes of various types are made in the sensor to maintain the high signal to noise ratio, since a high ratio is normally associated with an accurate count. Such changes have generally taken the form of increased illumination or decreased detector size, or both, plus signal enhancing circuits. However, when object spacing is reduced to zero, the resultant reduced contrast gradient at the boundaries between adjacent objects caused signal to noise ratios so low that the prior art sensors and counters suffered serious inaccuracies despite all efforts to effect signal enhancement.

The typical prior art signal enhancing means employed when the sensor signal is a time varying sinuosoidal wave train amplitude modulated by a much lower frequency, as is usually the case, is a high pass filter. However, such filtering means, whether they are simple RC or RL single time constant filters or tuned filters, have their limitations. That is, they are generally incapable of passing only the wanted higher frequency, indicative of boundaries when that frequency signal component is as little as 1/100 of the total amplitude of that of the complex wave and where the higher frequency is variable from 2 times the lower frequency to several hundred (RX) times the lower frequency.

Among the prior art counting devices and typical with respect to the contrast gradients encountered, is that disclosed by R. F. Massonneau in U.S. Pat. No. 2,417,427, issued Mar. 18, 1947. Massoneau's counting circuit employs a plurality of photocells to count discrete, spaced apart guide marks upon a printed ticket. Another prior art counting device is disclosed by J. T. Potter in U.S. Pat. No. 2,393,186, issued Jan. 14, 1946, wherein a photocell is utilized to count the spaced apart marks between a zero mark and the pointer position of an instrument dial. Both of these counting devices are typical of the prior art in that they require the high contrast gradient attainable with spaced apart objects, to enable their counting circuitry to operate reliably with accuracy. Further, and again typically, neither shows or describes a device for counting stacked objects wherein there is a very low contrast gradient at the juncture between adjacent objects.

SUMMARY OF THE INVENTION

A principal object of the invention is to provide a new and improved circuit for stripping noise components from a signal frequency in a composite wavetrain over wide variations in the amplitude and frequency rations of the signal to noise in the composite signal wavetrain.

The foregoing and other objects of the invention are achieved by a novel circuit which strips out of the complex composite wavetrain the highest frequency which is above a preset level. The nature of the invention and its several features and objects will appear more fully from the following description made in connection with the accompanying drawings.

DESCRIPTION OF THE PREFERRED EMBODIMENTS

Figures 1, 2, 3:
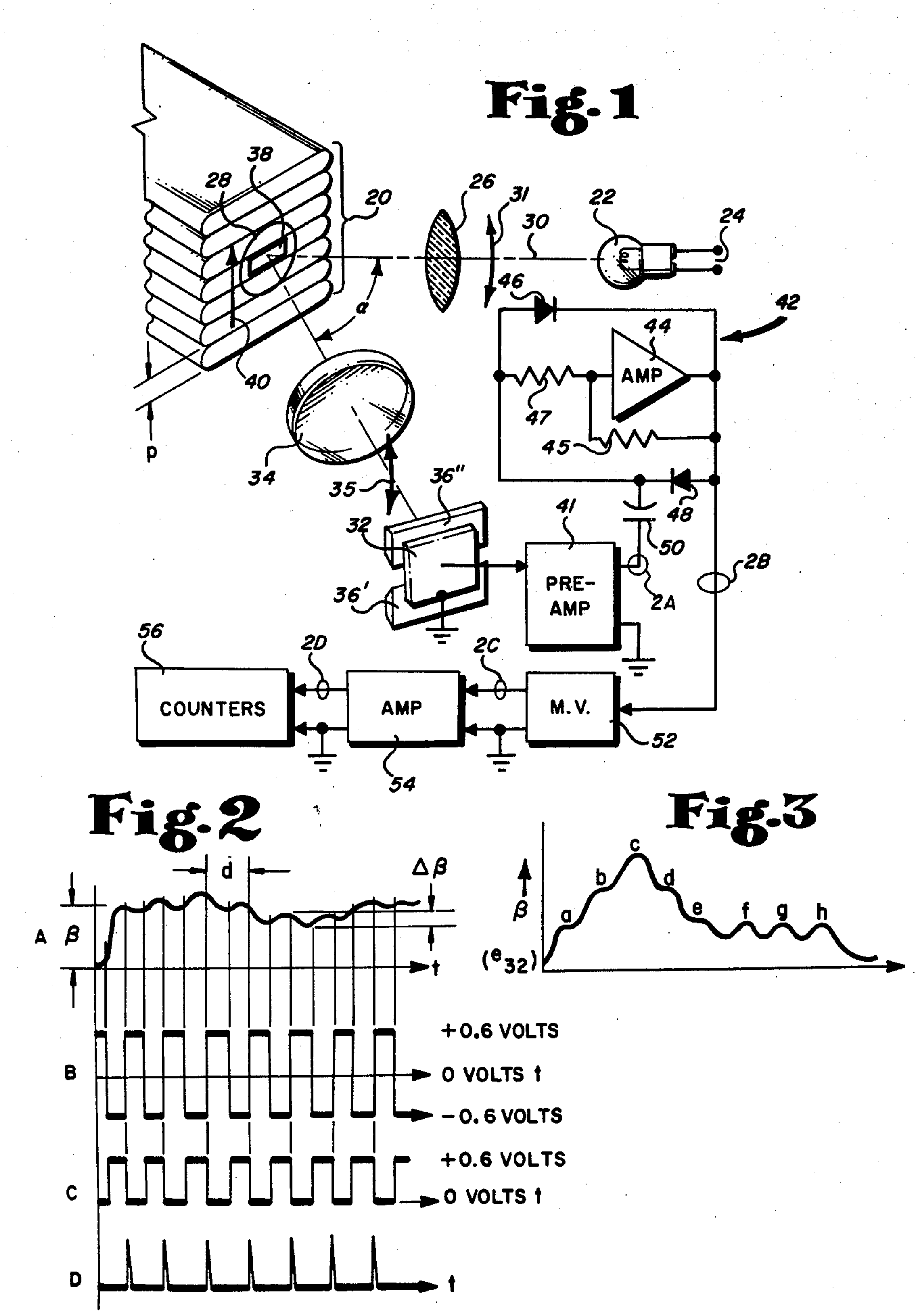
FIG. 1 is a schematic representation, partially in perspective and partly in block diagram form showing a simple version of the invention.
FIG. 2 is a wave form diagram illustrating output wave forms from the sensor of FIG. 1 and of the corresponding wave forms appearing at various points in the circuitry of FIG. 1.
FIG. 3 is a wave form diagram illustrating the electrical output corresponding to the reflectance of stacked plastic cards.

FIG. 1 illustrates in schematic form the principal components of the simplest form of the inventive detecting system. Objects having sheet-like edge characteristics are shown at 20 stacked adjacent one upon another with their edges proximately in alignment with one another. In such a stack, the edge reflectance of certain materials has a space varying reflectance signature associated with each sheet. This reflectance is nominally an optical characteristic and then appears as a change in apparent brightness $\Delta\beta$, but as will become apparent with different sensor and irradiation sources, may be acoustical, electrical, etc. Among the materials with such a signature and which provides adequate signal outputs from the inventive system, are stacked sheets of sheared steel. This material has little variation in the average apparent brightness $\beta$ of adjacent sheets but there is a small, but nevertheless distinct contrasting area associated with each sheet. There may be a slow change in the average brightness of the stack but, the sheet-to-sheet brightness difference is not large enough to obliterate the difference characteristic associated with each sheet.

A light source 22 is focused by condensing lens 26 on lighted area 28 on the edges of the stacked sheets 20. As can be seen, area 28 is preferably of sufficient size to illuminate three adjacent ones of the stacked sheets. Light source 22 is preferably excited by D.C. source 24, to insure that no A.C. signal component will be impressed on the system photo-sensor 32. Use of such a D.C. excited light source has proven advantageous as will become apparent later in this description.

An image of lighted area 28 is formed by objective lens 34 in or substantially in the plane of sensor array 32 and specifically in the plane of masks 36′ and 36″ positioned between the lens 34 and the sensor array 32. To provide enhanced signal amplitude and an averaging effect to overcome any problems created by waviness in the stacked sheets or burrs at their edges, the slit formed between masks 36′ and 36″ is made long and narrow with its major axis parallel to the boundary lines between adjacent sheets. To further enhance signal characteristics and prevent ambiguities therein, it has been found that the slit width is preferably adjusted so that the image 38 on the stacked material of the effective area of the sensor not blocked by the slit is less than the width of an individual sheet and preferably, between 20 and 100 percent of that width. Sensor 32 is positioned relative to the masks 36′ and 36″ so that only light passing through the slit therebetween from lens 34, can fall on the sensitive surface of the sensor array. In this manner the slit between masks 36′ and 36″ defines the active area of the sensor array 32.

In the majority of embodiments constructed, the sensor arrays have employed silicon photovoltaic cells. This particular type of cell is desirable since small in size and possessed of low impedance which matches the transistorized signal processing circuitry employed. Obviously, however, other types of cells operating with the same or different types of electro-magnetic or other radiation, may be employed depending on operating parameters. Further, although both lenses 26 and 34 have been shown for illustrative purposes as conventional spherical types, cylindrical lenses are useful, especially as an objective lens 34. Where cylindrical lenses are utilized, it has been found that improved spatial filtering of the imaged area is obtained. This improved spatial filtering is primarily due to the averaging effect caused when the sensor array "sees" a relatively long segment of each object edge as it traverses them. Spatial filtering can also be enhanced by increasing the length to width ratio of the active area of the sensor array. The preferred ratio between effective sensor array length and object edge thickness varies between 3 to 1 and 10 to 1.

As is apparent from the foregoing, the illumination source 22 and sensor array 32 with their associated optics and masks are advantageously mounted in a suitable frame to maintain these elements in a coplanar relationship and also to maintain proper focus of the optical elements thereof. One design for such a frame that has proven quite desirable, is that disclosed in the United States design patent of Robert C. Sheriff, U.S. Pat. No. Des. 215,133, issued Jan. 7, 1969, entitled "Sensing Head for Stacked Corrugated Counter." Of course, other frames may be suitable. Once mounted in such a frame, movement of these elements relative to the stacked material 20 in the direction of arrow 40 results in the generation of an output signal which, after amplification in preamplifier 41 appears as shown in FIG. 2A. In that and all other sub-figures of FIG. 2, time increases from left to right. In FIG. 2 the average brightness as detected by sensor array 32 is $\beta$ and variation in brightness as the cell moves one pitch of the material d, is $\Delta\beta\Delta$. Thus, each cycle of the highest frequency present in wave form A is an indication of the passage of one sheet of stacked material past the sensor array 32.

The wave form shown in FIG. 2A is highly idealized to permit its being illustrated readily. Ordinarily $\Delta\beta$ can be 1/100 or less of the total average brightness. Further, since in many embodiments of the inventive systems, the movement of the sensor array relative to the stacked material is manually accomplished, variations in the period *d* of the frequency attributable to scanning individual sheets, are also introduced. Since this variation is impressed on the slow cyclic variations in $\beta$ that are usually encountered, normal high pass or tuned filter means for separating the unwanted low frequency that is indicative of the quantity of stacked sheets, are unusable.

It is an advantageous feature of the invention that the signal stripping problems encountered and insoluable with ordinary filters, are overcome by the signal stripping circuit generally shown at 42. This circuit 42 with the circuit parameters of the invention, has the capability of stripping out the highest frequency present in the complex wave train output of sensor array 32 and providing a square wave output amenable to conventional digital counting techniques.

As shown in FIG. 1, the preferred embodiments of the operational amplifier 44 of signal stripping circuit 42 is of the type employing metallic oxide field effect transistors (MOSFET). In the signal stripping circuit 42, input resistor 47 and feedback resistor 45 establish an amplifier voltage gain of 6,000, silicon diodes 46 and 48 when fully conducting establish a saturating voltage of 0.6 volt with an input coupled through capacitor 50. With an amplifier gain of 6,000, a change of 0.0001 volts in the input signal at 2A, will result in an output of 0.6 volts to drive the output of amplifier 44 into the clamp of diode 46. Any further increase in the plus direction in the signal input, causes diode 46 to conduct and thus maintain the charge on capacitor 50 in substantially matching relationship with the incoming wave form.

With diode 46 conducting, the operational amplifier 44 is essentially shorted from input to output with the maximum voltage of the output being maintained at the potential necessary to overcome the diode junction potential; i.e., approximately 0.6 volts. As soon as there is a reversal in the wave form of the incoming signal 2A, the diode 46 ceases conduction and, when the signal has changed direction by 0.0002 volts, diode 48 will begin to conduct. As described with reference to diode 46, any further increase in the reversed signal will then cause diode 48 to clamp the operational amplifier 44 and the charge on capacitor 50 will substantially match the incoming wave. Thus, each time there is a reversal in the wave train in the aggregate amount of 0.0002 volts, the output of the signal stripping circuit 42 will reverse and there will appear at its output a square wave whose form is as shown in FIG. 23, each cycle of which is indicative of the passage of one sheet of material past sensor 32. The values described for the stripping circuit 42 are examplary only. If stripping at a higher or lower signal level is desired, the amplifier gain can be appropriately changed.

The square wave at the output of stripping circuit 42 is processed in a conventional bistable level multivibrator 52, the output of multivibrator 52 being illustrated in FIG. 2C. The wave train of FIG. 2C is coupled to the input of pulse forming amplifier 54. THe spiked output wave train of amplifier 54 is illustrated in FIG. 2D. As will be obvious to those skilled in the electronic counting arts, the FIG. 2D wave train is ideal in form for an input to the conventional decade counter 56 to which it is applied. From the foregoing, it can be seen that the inventive system will count the number of individual sheets its sensor is passed across as long as there are apparent brightness reversals associated with each sheet of the stacked material.

In the foregoing description of FIG. 1, a coplanar relationship of the sensor array and illumination source was shown and described, and for most stacked materials, such a relationship is preferred. However, with certain materials, such as stacked can lids, sharpened razor blades, and the like, it has proven advantageous to depart from this coplanar relationship as schematically indicated by double ended arrows 31 and 35 which indicate inclinations of the optical axes. Further, if the stacked materials or sheets are loosely arranged, it is often advantageous to match to the average center-to-center distance of the individual stacked objects or sheets rather than the thickness of a single sheet.

there are certain conditions and materials where the signature of the stacked material is more difficult to sense than that of the material shown in FIG. 1. For example, with tightly stacked boxboard or plastic sheets. it is not unusual to encounter a condition where there are quite different reflectances on adjacent sheets and no dark areas associated with each sheet. Such a reflectance signature is shown in the wave train illustrated in FiG. 3 and represents an extreme case such as is encountered with stacked plastic credit cards or similar materials. Since in the FIG. 3 wave train there are no reversals in brightness during the first 5 cards, ambiguities are present which could cause errors if the simple apparatus of FIG. 1 is employed to effect the count. Where, as in this example, the stacked plastic cards are credit cards, an error in counting of even one per 1000 is intolerable even though such an error would be entirely satisfactory in counting corrugated boxboard or other lower value material. Thus, it is essential for such potentially high value materials, that the signature ambiguities be resolved. It is a feature of the invention that these ambiguities can be resolved with the sensor array configured as illustrated in FIG. 4.

Figures 4, 5, 6:
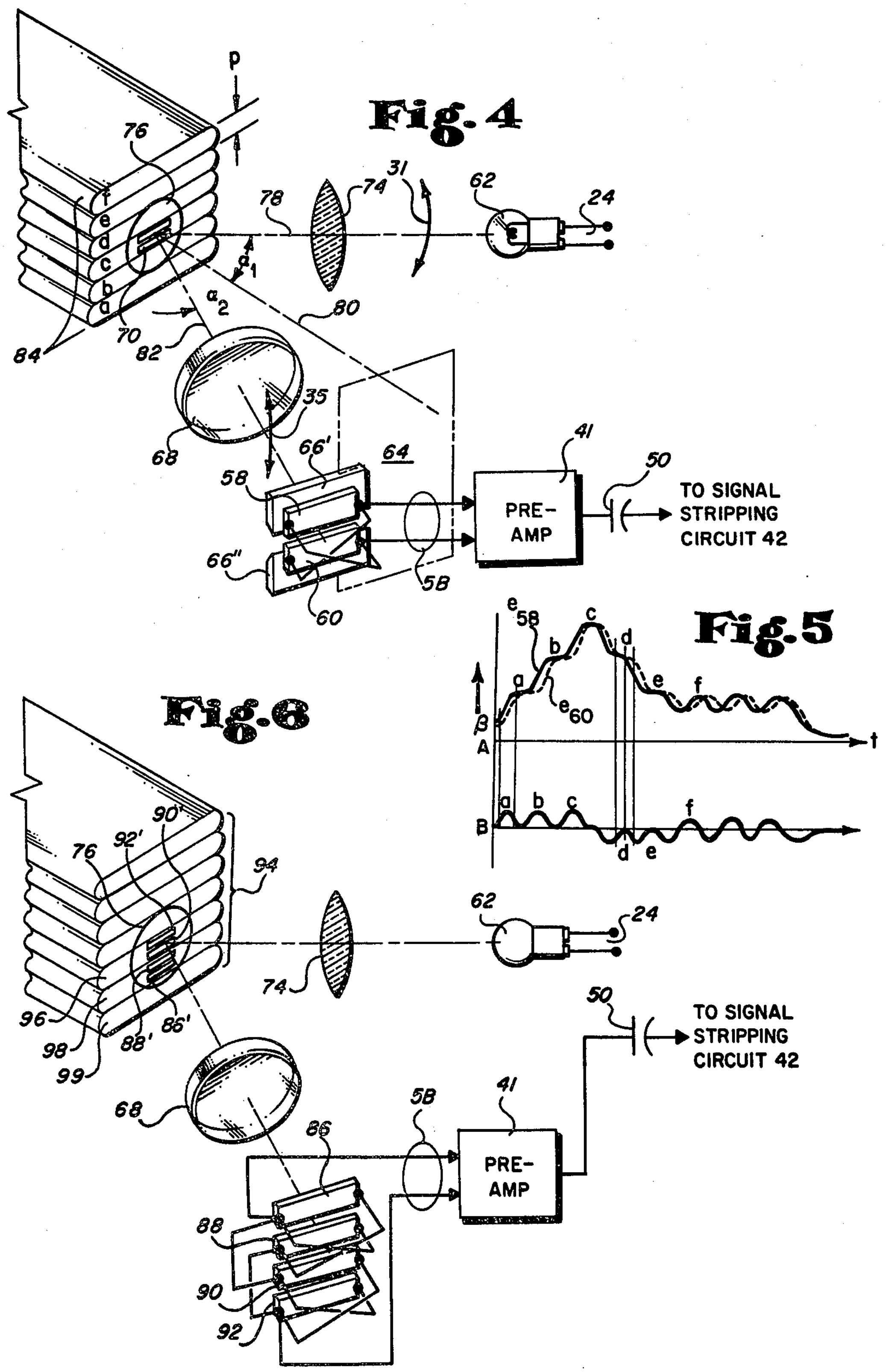
FIG. 4 is a schematic representation of an embodiment employing a more complex sensor configuration than that of FIG. 1 and showing preferred angular relationships.
FIG. 5 is a wave form diagram illustrating the output characteristics of the sensors of FIG. 4.
FIG. 6 is a schematic in perspective illustrating the relationships present when more than one pair of sensors is employed.

As shown in FIG. 4, the sensor array comprises two photo-sensors 58 and 60 and these are advantageously positioned in a particular spatial relationship to the stacked plastic cards 84, and the light source 62. Individual ones of the cards are designated *a, b, c,* etc. . The two photo-sensors are physically placed adjacent one another on an image plane 64 that is proximately parallel to the face of the stacked cards. The sensors are separated from each other by as small a gap as practical. 0.001 inch being typical. The two sensors comprising the array are electrically connected together in parallel opposition and their output connected to pre-amplifier 41 and subsequent circuitry that is identical to the signal processing circuit shown in FIG. 1 that processes the signal from a sensor array having but a single sensor. Positioned between the sensor array 58–60 and the stacked cards are two guillotine type masks 66' and 66''. The space between the two masks is adjusted so that the image 70 of the paired photo-sensors of the array as projected on the edge of the stacked cards by objective lens 68, is substantially equal in width to the pitch $p$ of an individual one of the cards in the stack to be counted.

When light source 62 is focused by condensing lens 74 to illuminate a lighted area 76 on the object plane, and the entire combination of source and sensor array with associated optics is caused to scan the stacked cards from a to $f$ (etc.), the photo-sensors each generate an output signal such as shown in FIG. 5A. With a pair of sensors connected in parallel opposition as shown, their composite output wave train is as shown in FIG. 5B. This parallel differential output of the sensors approximates the first derivative of brightness across the elements of the stack; that is, since each of the sensors is only looking at a segment of one card's edege, that segment's brightness $\beta$, represents a part of the total brightness of the one card's edge. Then, the difference in brightness from one segment to another approximates the first derivative: $\Delta\beta_{58}-\Delta\beta_{60}=d\beta/dp$. The wave train output of the paired sensor array as shown in FIG. 5B, is a close approximation to the output of the single sensor of FIG. 1 as shown in FIG. 2A. Thus, the sensor array comprising a differential cell pair provides good ambient brightness rejection and resolves the ambiguities present when there are not reversals in brightness between adjacent cards, as shown in FIGS. 3 and 5. Further, when the sensor array is so comprised, its output is entirely suitable for operating the signal processing circuitry of FIG. 1.

As shown in FIG. 4, the sensor array 58-60 lies in image plane 64. As also shown, the optical axes 78 and 82 of the light source and sensor respectively, are inclined with respect to normal line 80 which is perpendicular to stacked cards 84, and the two axes and the normal are preferably included in a common plane. The angles $\alpha_1$, and $\alpha_2$ are variable within very wide ranges, the particular angles for any one sensor-source combination being empirically determined based upon the edge reflectance characteristics of the stacked sheets of the stack. In general, the angles are chosen so that non-ambiguous constrast associated with each sheet is maximized. Almost universally, maximum non-ambiguous contrast is achieved when the angles are such that the resultant illumination as viewed by the sensor is principally lambertian in character rather than specular. This is ordinarily achieved by making the total included angle comprising the illumination angle, $\alpha_1$, plus the sensing angle, $\alpha_2$ equal to somewhat less than 90°, and by maintaining $\alpha_2$ less than 30°.

Lambertian illumination is preferred over specular since with specular illumination there is a tendancy to pick up false signals due to the surface roughness present in the edge of the sheet. The false signals caused by surface roughness are generally at a maximum when $\alpha_1$ and $\alpha_2$ are zero degrees or substantially equal and of opposite sign.

Another factor in establishing angles $\alpha_1$ and $\alpha_2$ is maintaining focus. Since the best signals are achieved when the image of the sensor array is in focus on the sheet edges, it is desirable that maximum depth of focus be maintained for objective lens 68 and this occurs with $\alpha_2$ at zero degrees. Then $\alpha_1$ can be increased to achieve the objective of lambertain illumination while maintaining depth of focus. However, in achieving this lambertian quality, as $\alpha_1$ approaches 90°, illumination level is lost due to the grazing character of the light incident on the surface of the sheet edges. As a result, it is necessary to make some compromise in the angle of illumination $\alpha_1$ so that that the total objective of lambertian illumination with maximum signal can be achieved. For nonmetallic elements such as boxboard and plastic sheets, contrast has been maximized when the illumination angle $\alpha_1$ has been set at approximately 60° and sensing angle $\alpha_2$ at approximately 20° as shown in FIG. 4.

Where the contrast is very low, signal characteristics are enhanced by the use of multiple sensor arrays. Such a configuration is illustrated in FIG. 6.

In FIG. 6 two sensor arrays, each comprising a pair of sensors, are utilized, each array being imaged on an individual sheet, the two arrays being imaged on adjacent sheets. The optical arrangement of FIG. 6 is identical to that of FIG. 4 except that the masks 66′ and 66″ have been dispensed with and two sensor arrays are employed in place of one. The four photo-sensors 86, 88, 90, and 92, comprising the two arrays, are imaged on the edges 96 and 98 of stack 94 at 86′, 88′, 90′ and 92′, the prime designation indicating the image of its respective sensor The two sensor arrays are of such a size and so spaced, considering the magnification of lens 68, that each array is substantially matched widthwise to the thickness of one sheet. Each sensor of a sensor array is electrically connected in parallel opposition to its corresponding sensor and the two arrays are connected in parallel, the summed parallel output being connected to preamplifier 41 in the same manner as the single sensor array. However, the use of multiple sensor arrays necessitates modification of the counter as is described below.

Figures 7, 8, 11:
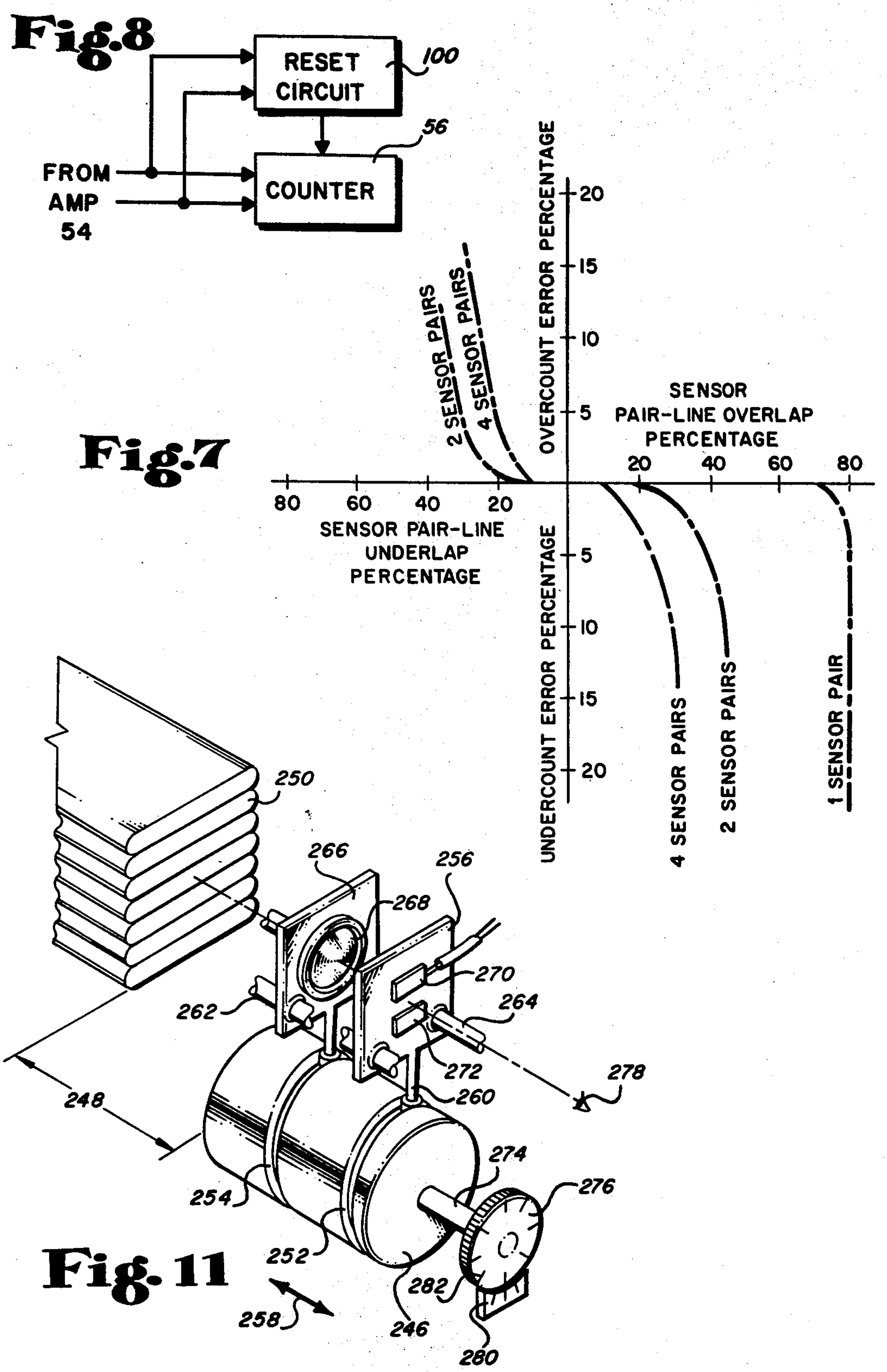
FIG. 7 is a graph illustrating the effects upon counting accuracy of errors in pitch matching for various sensor configurations.
FIG. 8 is a block diagram illustrating a modification to the circuitry of FIG. 1 to effect count correction when multiple sensor pairs are employed.
FIG. 11 illustrates in simplified perspective a means of adjusting the pitch of a sensor pair.

The advantages of utilizing a multiplicity of sensor arrays, each array comprising at least one sensor, can be appreciated if the reflectance characteristics of low contrast materials are considered. If in the illustration of FIG. 6 it is assumed that between sheets 96 and 98 there is zero contrast, while between the edges of sheets 98 and 99 there is sufficient contrast to effect an output from sensors 86 and 88, it can be seen that an output from the two cell pairs to preamplifier 41 will still be achieved. For even lower contrast materials, similar image enhancement is achieved if still more sensor arrays are added, each array being imaged on one sheet edge. However, the proliferation of sensor arrays is not without practical limit as FIG. 7 illustrates.

With some materials a single sensor effectively matched to a fraction of the pitch of the stacked materials provides non-ambiguous signal characteristics superior to a sensor pair. Signal enhancement can be provided by effectively matching the center-to-center distance of adjacent ones of single sensors in a uniformly spaced multiple array to the pitch of the stacked materials. The practical limit of number of individual sensors in the array is similar to the limit of sensor pairs as illustrated in FIG. 7.

As can be appreciated, as the thickness of the sheets in a stack decreases, it becomes increasingly more difficult to effect a good match between the image of one sensor array and the edge thickness of one sheet. With very thin sheets, on the order of the thickness of thin paper (0.002–0.004 inches), and with plural sensor arrays, the matching problems become quite sever. The effect of error in pitch matching of various numbers of arrays of sensor pairs, is illustrated in FIG. 7. As there shown, increasing the number of sensor array as is desirable for image enchancement purposes, increases the sensitivity of the system to pitch mismatch with consequentially increased counting error percentages. similarly, using one sensor array with attendent reduced image enhancement, decreases the sensitivity to mismatch. In fact, with one sensor array, depending on the contrast variations present and the uniformity of thickness of the stacked sheets, there can be usuable signals right up to 95 to 98 percent mismatch. Why this is so is apparent if one considers a uniform increase or decrease in the image size of all of the elements of a multiple sensor pair array relative to a fixed thickness size of the sheets.

Another requirement encountered when more than one sensor array is utilized, is the necessity of effecting corrections in the counting circuit to compensate for the extra arrays, it being necessary to subtract one count for each array used in excess of one. Such subtraction is accomplished by a modification of the FIG. 1 circuit as shown in FIG. 8. As FIG. 8 illustrates, parallel connecting an auxiliary high speed momentary reset circuit 100 with counters 56 will enable the subtraction operation at the beginning of counting. Circuit 100 accumulates as many counts as there are sensor arrays in excess of one and then resets counter 56 to zero as soon as that count is reached. Thus, if there are two sensor arrays, the reset circuit counts to one, then resets counter 56 to zero and then becomes inactive until the beginning of the next counting cycle. Thereafter, counter 56 would count as long as data is received. Reset circuit 100 remains inactive until the counter 56 is manually reset after counting is complate. After resetting, reset circuit 100 is reactivated in preparation for again resetting counter 56.

Figures 9, 10:
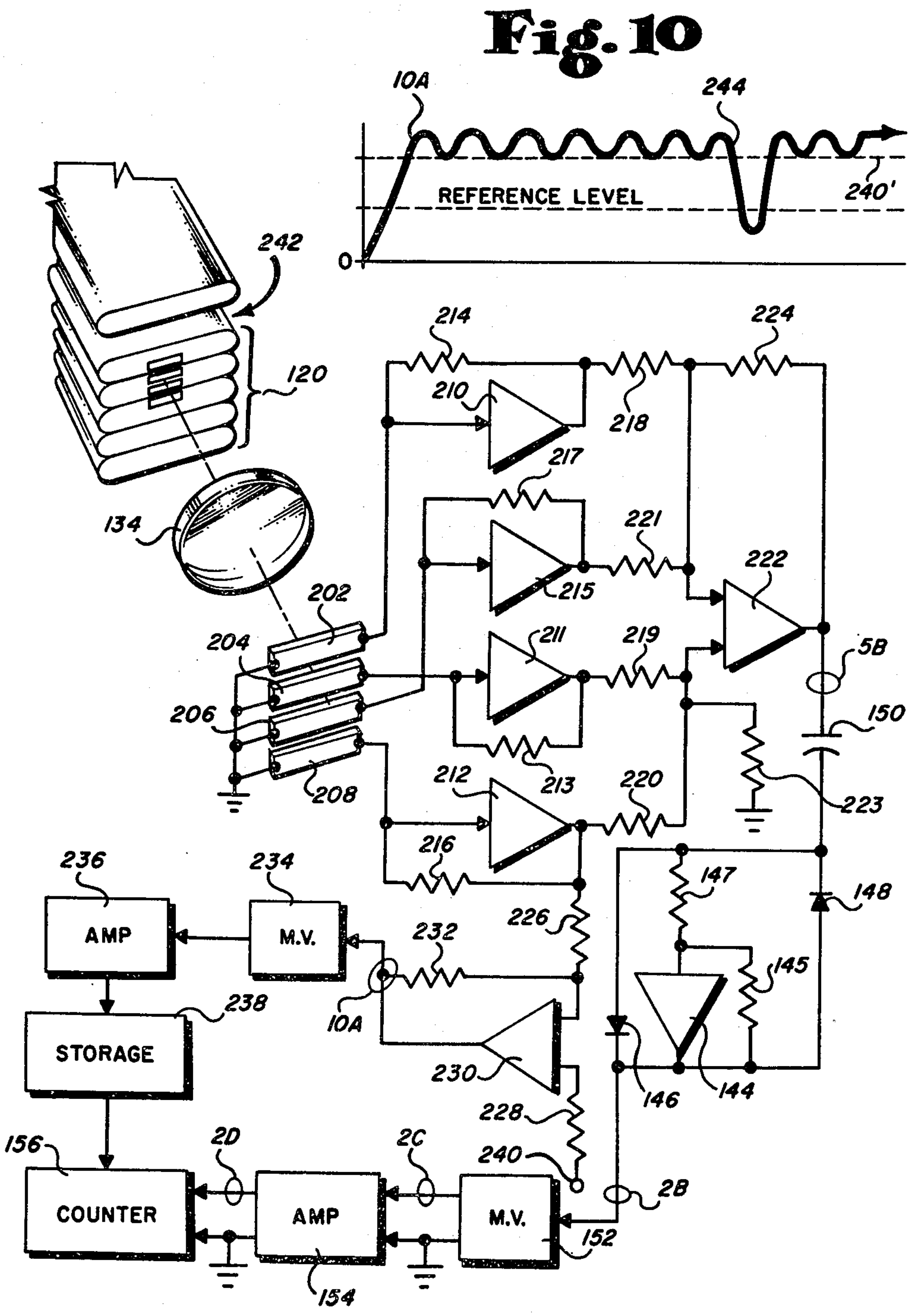
FIG. 9 is a mechanical-electrical schematic, partially in perspective and partially in block diagram form, illustrating the circuitry utilized to effect count correction when voids are encountered in the stacked material being counted.
FIG. 10 illustrates a wave form present in the circuitry of FIG. 9.

The foregoing method of correcting the counting is satisfactory as long as the stacked material is tightly stacked and the edge of the stack does not have voids such as might be caused by warpage or setbacks in the sheets. When such a condition is encountered, a new method of subtracting to compensate for plural sensor arrays, is essential. A circuit used to correct the count when voids are present in the edge of the stacked sheets being scanned and counted, is shown in FIG. 9 wherein circuit components that are identical to those of FIG. 1 are identified with the identical reference numeral plus one hundred.

Sensors 202, 204, 206, and 208 are connected as shown to provide a two sensor pair array to enable image enhancement and also, to measure brightness for void and count correction purposes as explained below. The outputs of each sensor are applied to low drift operational amplifiers 210, 211, 212, and 215, each with its respective feedback resistor 214, 213, 216 and 217. These amplifiers preserve the wave form present at their inputs while raising the potential thereof. The output of the four operational amplifiers is coupled into differential amplifier 222 through summing resistors 218 and 221 and 219 and 220. Resistor 224 provides a feedback path around amplifier 222, resistor 223 to ground advantageously being of the same value as resistor 224 to enable best common mode rejection. Amplifier 222 combines its input signals and provides an output signal equivalent to that from a two sensor array such as that of FIG. 6. This output signal is processed in stripping circuit 142, bistable multivibrator 152, pulse forming amplifier 144 and counter 156 in a manner identical to that described with respect to FIG. 1.

After amplification in operational amplifier 212, the ouput signal of the individual sensor whose image first traverses the stack 120, is applied through resistor 226 to a brightness analyzing circuit comprising a brightness reference amplifier 230. Amplifier 230 has as its second input, a reference potential applied through resistor 228 from terminal 240. Resistor 232 provides a feedback path around amplifier 230. By virtue of this connection of amplifier 230, the first cell traversing the stack can be used to measure the brightness of the stack, since the potential at the output of amplifier 230 corresponds to the sensed brightness level oscillating about a voltage level established by the potential applied at 240. This brightness output signal is shown at 10A in FIG. 10 wherein the level applied at terminal 240 is designated 240'.

Whenever a hole is encountered in the stack such as that shown at 242, the operate point of brightness reference amplifier 230 drops below a reference level and, as shown at 244 in FIG. 10, this reference level can conveniently and advantageously be one-half the level applied at 240. This drop trips monostable multivibrator 234 which generates a square output pulse. This pulse is processed in pulse forming amplifier 236 and passed to storage register 238. The pulse stored in register 238 is the output signal of the brightness analyzing circuit and can either by used immediately to blank out the next counting pulse appearing in the wave train shown in FIG. 2 at D, or used later to subtract one count from that appearing on counter 156, the first alternative being preferred, since simpler to execute.

The foregoing description of a circuit for effecting the count correction necessary when holes are encountered in the stacked sheets has been in terms of four sensors connected to be two sensor pairs. Obviously, this circuit will also effect the count correction required by the presence of the second sensor pair. This same circuit can also be used when more than two sensor pairs are employed, if amplifier 236 is used to generate appropriate numbers of additional pulses. This same circuit can also be used with a single sensor or multi-sensor array to effect a blanking data when the sensor array passes by and receives signals from displaced surfaces. This blanking is effected whenever the sensor output signal indicates a brightness level below a predetermined reference level such as illustrated in FIG. 10.

The foregoing discussion has indicated the desirability and necessity of achieving the best possible match between the image widths of a sensor array and the thickness of one sheet. It is a feature of the invention that this match may be closely achieved by the inventive apparatus. a manual optical-mechanical method of determining and achieving pitch matching is shown somewhat schematically in FIG. 11.

In the apparatus of FIG. 11 a drum cam 246 is spaced a fixed distance 248 from the plane including the aligned edges of the sheets comprising stack 250. Cam 246 carries two cam grooves 252 and 254. Sensor carrier 256 is mounted above groove 252 and constrained to follow it in the direction of double ended arrow 258 because of cam follower 260 and guide rails 262 and 264. Lens carrier 266 is similarly constrained to follow groove 254 by a cam follower (not shown) and rails 262 and 264. Lens carrier 266 supports an objective lens 268 extending therethrough, while sensor carrier 256 supports a multi-element sensor array 270 and a grating 272, each positioned behind aperatures in the carrier. Cam 246 is rotatable by means of knob 276 which is affixed to it by shaft 274.

The grooves 252 and 254 in cam 246 are so configured that by rotating the cam, holders 256 and 266 are moved relative to each other and to stack 250 so that the ratio of object size to image size can be varied over a wide range while maintaining distance 248 fixed and while maintaining a good focus at the image plane. In one embodiment with lens 268 an f/2.8 triplet of ½ inch focal length, the object size to image size has been made variable over a 10 to 1 ratio. Thus, in this embodiment, for a sensor pair array width of 0.02 inch the sensor array width could be matched to sheet thicknesses varying between 0.007 and 0.07 inch.

In achieving the match of sensor array image width and sheet thickness, calibrations 282 on knob 276 can be set with respect to index 280 as a first approximation. However, for best results, the pitch should be matched more closely than is possible with the index. It is an inventive feature that the desired closer match is achieved by using the principal of Moire optical interference patterns. These patterns are generated when two optical gratings of similar pitch are placed in proximity and viewed. In the FIG. 11 embodiment, an optical grating 272 of substantially identical pitch to that of a sensor array is positioned in the same image plane as the sensor array. Then when an observer 278 rotates the knob 276, the correct match of sensor array image width to sheet width will be achieved when a proper Moire image is formed by the combination of grating 272 and the image of stack 250. The determination of a proper Moire image is facilitated by placing the grating 272 at a slight angle with respect to the horizontal lines separating the sheets of the stack 250. This causes the appearance of vertical bars that reduce to a minimum number for the best match and whose numbers increase with increasing mismatch.

Figures 12, 13:
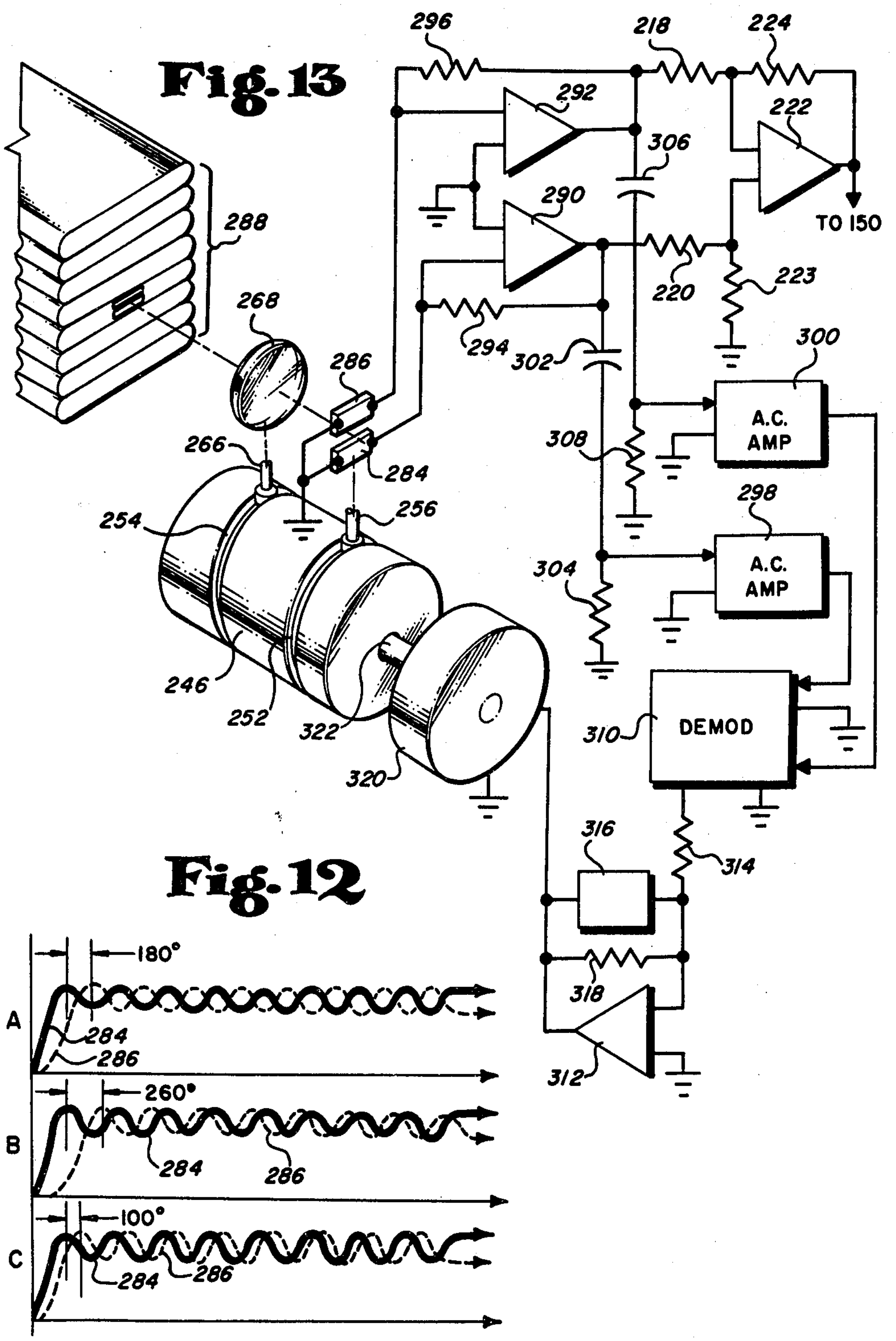
FIG. 12 is a wave form diagram illustrating the wave form outputs of a sensor pair for various conditions of pitch match.
FIG. 13 in perspective and electrical block diagram form, shows means for automatically effecting pitch match of sensors.

The foregoing described method of matching the pitch of the image of a sensor array to the thickness of a sheet of material in the stack was manual in character, requiring an observer to observe and minimize Moire fringes. It is a feature of the invention that the output signals of a sensor pair comprising an array may themselves be utilized to automatically achieve the desired pitch match. The output signals of a sensor pair 284–286 of FIG. 13 are shown in FIG. 12 for a matched condition as well as an undermatched and overmatched condition. In FIG. 12A the output of the two sensors is shown as 180° out of phase as is the case when pitch match of the sensor pair to the thickness of the sheets is exact. When the imaged pitch of the two sensors is more than the thickness of the sheets 288 (overmatch), the output of the two sensors is as shown in FIG. 12B, the overmatch being exaggerated for illustrative purposes. FIG. 12C is similar to FIG. 12B but instead illustrates the undermatch condition where the image of the sensor pair is less than the thickness of a sheet 288. Since for reasonable departures from a matching condition the phase of the signal output of sensor 286 with respect to that of sensor 284 varies about 180° point in proportion to the mismatch present, the phase difference can be employed as an error signal in a pitch matching servo system such as that shown in FIG. 13.

The FIG. 13 embodiment is similar to that of FIGS. 9 and 11 and, where identical, identical reference numerals have been employed. As in FIG. 11, the object to image size ratio obtaining is controlled by cam 246 and carriers 256 and 266 supporting the sensor array and objective lens, respectively. The outputs of sensors 284 and 286 are applied to low drift operational amplifiers 290 and 292 each with its respective feedback resistors 294 and 296. The output of the two operational amplifiers is coupled into differential amplifier 222 and the combined output signal passed to capacitor 150 and the ensuing circuitry shown in FIG. 9 but eliminated here for the sake of drawing simplicity.

Demodulator 310 is arranged to produce a zero D.C. output potential when the phase of sensor 286 is 180° with respect to that of sensor 284. When the phase of sensor 286 increases beyond 180°, the output voltage of demodulator 310 goes positive to a potential proportional to the phase shift. a similar condition occurs with a negative output potential when the phase difference is less than 180°. The output of demodulator 310 is applied to D.C. servo amplifier 312 through resistor 314, feedback resistor 316 and servo loop stabilizing circuit 316 being connected in conventional manner between the input and output of amplifier 312. The output of amplifier 312 is applied to D.C. servo motor 320 which rotates shaft 322 and hence cam 246 to correct the sensor phase difference to 180°. For setting convenience, a knob (now shown) is preferably employed on shaft 322 to enable a first approximation of pitch match to be made manually.

Figures 14, 15, 16, 18:
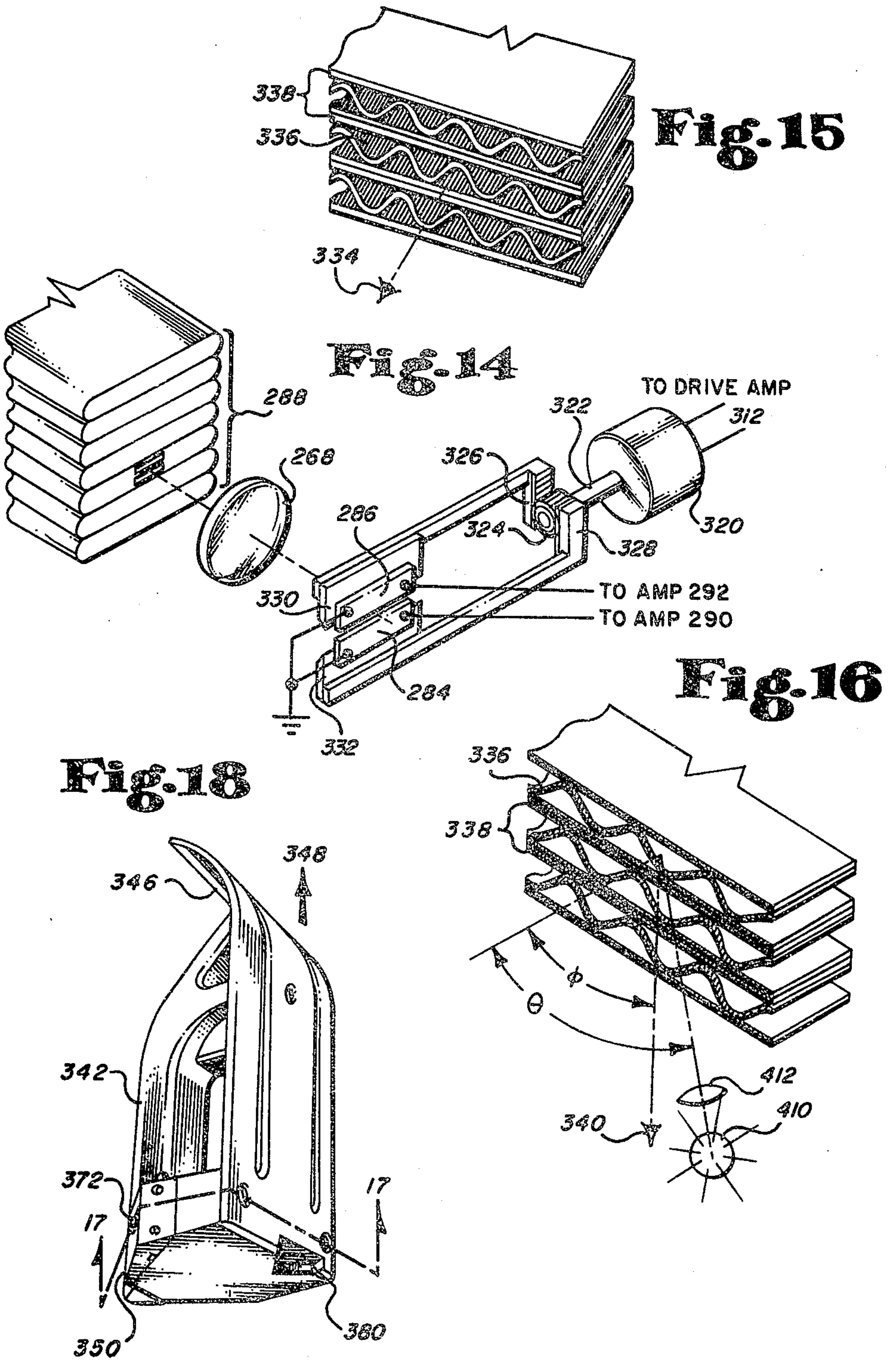
FIG. 14, in perspective schematic form illustrates an alternative means for automatically adjusting sensor pitch.
FIG. 15 illustrates the appearance of stacked corrugated material when viewed normal to its edge.
FIG. 16 shows the varying appearance of corrugated when viewed obliquely.
FIG. 18 is a view in perspective of a sensing head.

FIG. 14 illustrates another method of automatically achieving a pitch match utilizing the phase error determining circuitry of FIG. 13. In place of cam 246 and carrier arrangement of that figure, guillotine blades 330 and 332 are arrange to selectively mask the sensors 284 and 286 in the manner described in connection with FIG. 4. However, the two guillotine blades are differentially connected for adjusting movement by means of racks 326 and 328 and pinion 324. Pinion 324 is secured to the output shaft of D.C. servo motor 320. For the sake of illustrative simplicity, the guides for blades 330 and 332 and a manual setting knob have not been shown. By means of this rack and pinion differential arrangement, whenever there is a pitch overmatch or phase difference in excess of 180°, the guillotine blades are driven toward one another and similarly but apart for a pitch undermatch.

When an array of multiple sensor pairs is used for signal enhancement, it is often desirable to use the outputs of alternate sensor elements as the inputs to A.C. amplifiers 298 and 300. In this case, the demodulator 310 and polarity of the entire width control servo loop are designed to provide a stable null when the phase difference of signal inputs to A.C. amplifiers 298 and 300 is 0° instead of 180° as is the case with inputs from the two elements to a single sensor pair.

One of the most difficult of materials to count by electro-optical-electrical methods is corrugated boxboard such as is shown in FIGS. 15 and 16. The difficulty arises because of the relatively large amount of contrast variations present as can be appreciated when considering FIG. 15. As there shown, when the corrugated is both viewed and illuminated normal to the surface, the outside surface of the flutes 336 and the area surrounding the flutes is dark, and the liner edges 338 as well as the flute edges appear bright. As a consequence of this and of flute location, counting of contrast edges does not result in an accurate count. It is a particular feature of the invention that the ambiguities which result in the inaccurate counting of corrugated are overcome by viewing the corrugated as shown in FIG. 16 and as implemented with the inventive structural embodiment described with respect to FIG. 17.

Figures 17, 19:
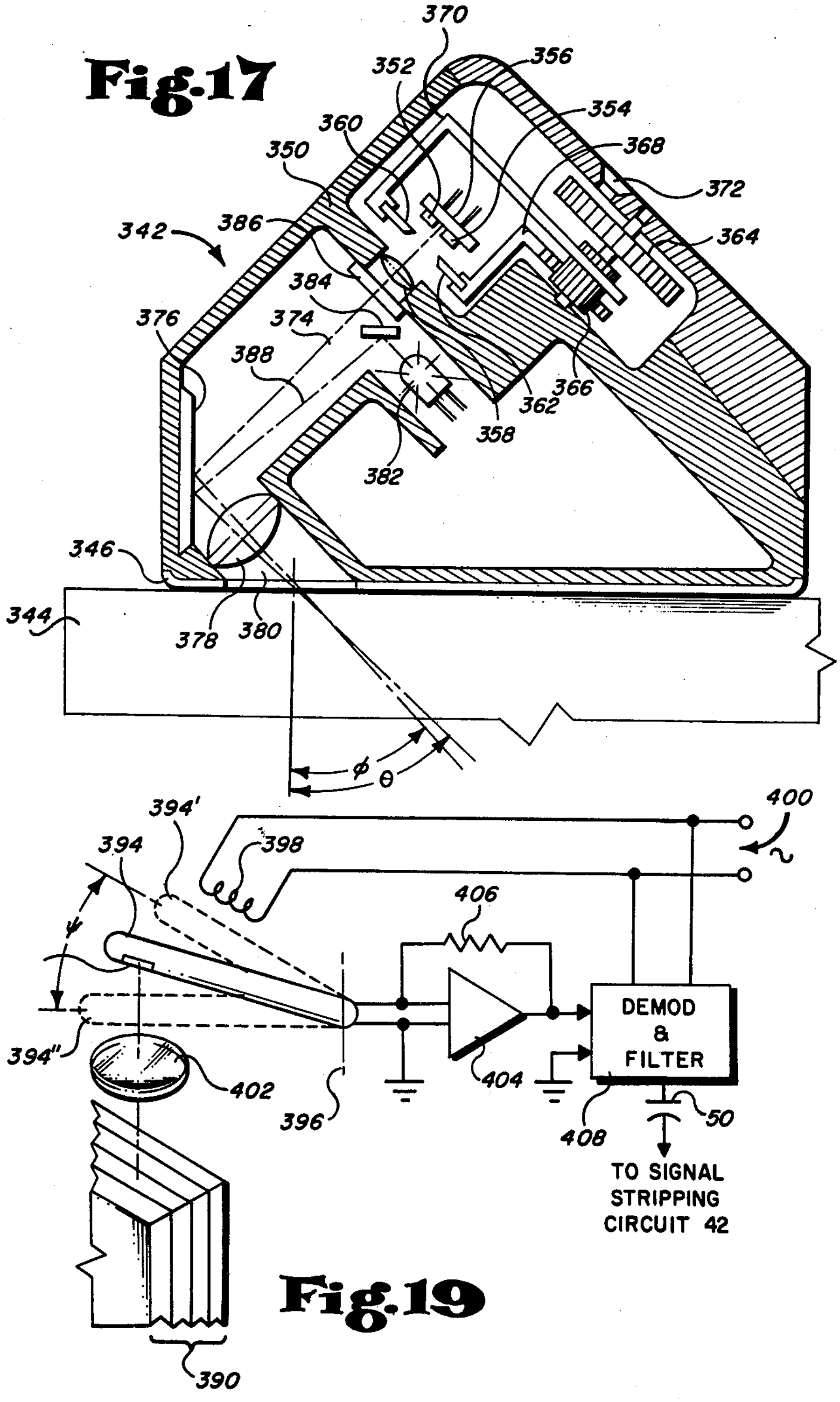
FIG. 17 is a section taken at 17—17 of the sensing head shown in FIG. 18.
FIG. 19, in schematic perspective form, shows an alternative sensor and associated electrical circuit.

As shown in FIG. 16, it has been discovered that viewing and illuminating the edge of the corrugated at an oblique angle will, if the angle is properly chosen, resolve the ambiguities which cause the inaccurate count. It has been found that if the sensing angle $\phi$ is between 40° and 60° and the illumination angle $\theta$ is within 20° of the sensing angle, the viewer (or sensor) 340, viewing the same stack of corrugated as viewed head-on in FIG. 15, preceives an entirely different set of contrast conditions. The illumination source 410 is focused by condensing lens 412 upon the corrugated material edges at the angle $\theta$ thereto and the viewer 340 is positioned as shown with respect to the source and the corrugated material. With the illumination and sensing angles so disposed, the outside surfaces of the flutes 336 now appear as bright areas between the darker flute edges 336 and top and bottom liner edges 338. Further, even if there is a void in the stack, that void appears dark since there is nothing there to reflect light. As stated above, the ratio of the effective sensor pair length to object thickness is important and ideally the ratio should be between 3:1 and 10:1. In FIG. 16 all edges appear dark as compared to the outer surfaces of the flutes which appear relatively brighter than the dark lines that are the flute edges. In order to prevent these dark lines from introducing false counting data, it can be seen that the sensor length should cover several convolutions of the flutes in order to integrate out this effect. Thus, counting the bright areas results in an exact count of the stack. The inventive sensor-light source supporting structure is shown in FIG. 17 which is a simplified cross-section taken at 17—17 in FIG. 18. FIG. 18 is a view in perspective of the sensing head that is the subject matter of the aforementioned design patent of Robert C. Sheriff.

As shown in FIG. 17, the sensing head 342 advantageously rests upon the edges of the corrugated material 344 it is desired to count. For ease and smoothness of operation, a curved baseshoe 346 contacts the stacked corrugated 344 as the sensing head is moved in the direction of arrow 348 (FIG. 18) to traverse the stack. Housing 350 affixed to base-shoe 346, provides support for the mechanical and optical elements of the sensing head. Photo-sensors 352 and 354 are affixed to a common substrate 356 which is in turn affixed to frame 350, sensors 352 and 354 advantageously being connected to circuitry such as illustrated in FIG. 3. The sensors 352 and 354 are positioned on an image plane located at the back-focus of objective lens 358 plus or minus 10 percent. Objective lens 358 in one illustrative embodiment has advantageously been an f/2.8 with a 12.5 millimeter focal length.

Interposed between lens 358 and the photo sensor 352 and 354 are two guillotine type masks 360 and 362. The two masks are slideably positioned in grooves (not shown) in the housing 350 to enable their relative adjustment to effect pitch matching. This relative adjustment is achieved by means of rotating thumbwheel 364 which has affixed thereto pinion 366 which in turn acts upon levers 368 and 370 affixed to the two guillotine blades. By observing through window 372 the graduations (not shown) upon the face of thumbwheel 364 an operator can select the desired pitch match. In this regard, it may be helpful to those unacquainted with corrugated to realize that such materials are made in several discrete sizes and that the graduations upon thumbwheel 364 can be symbols indicating these sizes. For counting corrugated material while utilizing a single sensor array, achieving a pitch match in this manner has proven entirely satisfactory. The optical axis 374 forming the center of the ray beam defined by lens 358 and the sensor array, is reflected by front surface fixed mirror 376 to pass through field lens 378 and thence, to emerge through aperture 380 to impinge upon the stacked corrugated material 344 being counted. In the preferred embodiment, field lens 378 has been a doublet with achromat characteristics and a 75 millimeter focal length. Such a lens when positioned at the front focal plane of objective lens 358, plus or minus 10 percent adequately collimates the image of the sensor array; thus allowing for large offsets in the stacked materials.

To ensure adequate illumination and against faulty output signals from the photo-sensor pair employed there is provided a light source 382 and filter means 386. Light source preferably comprises a "lens-on-lamp." The light beam 388 is deflected by mirrors 384 and 376 in turn before passing through field lens 378 to illuminate the corrugated being counted. By suitably choosing the angle of mirror 384, the light beam 388 can be made nearly coaxial with the ray beam 374 to the sensor array. Because of this advantageous construction it is possible to maintain the angle $\theta$ within the optimum limits described above.

To ensure that ambient light does not generate erroneous counts, particularly when the sensing head is not in contact with material to be counted, there is provided a filter 386 in the optical path of the photosensors. By matching filter 386 to the spectral characteristics of the ambient surround, such erroneous counts can be eliminated. In one embodiment there has advantageously been employed a "Wratten–87C," Infrared band pass filter. This filter rejects both visible daylight and the light of flourescent lamps while passing a high percentage of the IR radiation of light source 382 that is reflected from the corrugated material.

In each of the foregoing described embodiments of the inventive apparatus employing an array of one or more sensor pairs, the individual sensor pair in each instance has the width of its image substantially matched to the thickness of one sheet of a stack to be counted. It is a feature of the invention that a single oscillating sensor may be employed to achieve the output equivalent of one or more sensor pairs. The embodiment schematically illustrated in FIG. 19 provides such an output. There, stacked sheets of material to be counted, 390, are positioned beneath photo-sensor 392 mounted in an oscillating arm 394. Arm 394 is oscillated about pivot axis 396 between two fixed positions indicated in phantom outline at 394' and 394'' by a conventional moving coil type of electro-mechanical drive schematically indicated by arm drive coil 398. Coil 398 is excited by an A.C. reference signal applied to the circuitry at terminal 400. The combination of oscillation and physical size of the sensor 392 must result in a scan excursion equal to the thickness of one or more of sheets 390 depending on the number of sensor array equivalents desired.

An image of the sheet edges is formed by objective lens 402 in or substantially in the plans of movement of oscillating arm 394 and specifically in the plane of photo-sensor 392. Advantageously the shape of sensor 392 has been made long and narrow with its major axis parallel to that of arm 394. This shape and alignment provides an averaging effect to aid in overcoming any false data effect caused by variations in individual sheet reflectance.

In practice, the frequency of oscillation of arm 394 is several times higher than any frequency generated by traversing the sensor image across the contrast variations in sheets 390. This insures that the output signal respresentative of contrast variations can be separated from the oscillation signal component. The signal output of sensor 394 is amplified in a low drift operational amplifier 404 having an associated feedback resistor 406 which raises the signal potential. The output of amplifier 404 is applied to demodulator/filter 408 where it is synchronously demodulated by the same oscillation frequency applied to arm 394 at terminal 400. After demodulation and filtering, the signal at the output of demodulator/filter 408 is equivalent to that generated by any sensor array and can be applied and processed in the same signal processing circuitry as is shown in FIG. 1.

The foregoing description has been in terms of electro-optical sensors. However, any transducer may be employed that can be pitch matched and detect a contrast characteristic associated with individual ones of stacked elements, acoustical, magnetic, fluidic, capacitive, etc., including where necessary an appropriate source of energy directed at the sensed area of the stacked objects. Further, for the sake of simplicity, in illustration, electro-optical sensing methods are shown in the drawing and FIGS. 9, 11, 13, 14 and 19 do not illustrate the presence of a light source such as is shown in FIGS. 1, 4, and 6. However, although in certain environments a light source may be dispensed with, in the majority of instances where electro-optical sensors are employed the use of such a source is preferred since it enables the use of filters to ensure ambient rejection in the manner described in connection with FIG. 17 and further, permits peaking of sensor output in the spectral region of greatest sensor sensitivity.

The invention has been described in detail herein with particular reference to preferred embodiments thereof. However, it will be understood that variations and modifications can be effected within the spirit and scope of the invention as described hereinabove and as defined in the appended claims.

We claim:

1. A circuit for stripping the highest frequency above a preset threshold level present in a signal wave train having more than one frequency component comprising capacitive input coupling means, and non-linear clamping circuit means comprising a diode clamped operational amplifier having a preset threshold level and connected at its input to said capacitive input coupling means to maintain the charge thereon in substantially matching relationship with said highest frequency above said preset level, the output of said non-linear circuit means being a square wave indicative of said highest frequency above said preset threshold level present in said signal wave train.

2. A circuit for stripping the highest frequency in accord with claim 1 wherein said preset threshold level of said non-linear clamping circuit means is established by the amplifier gain and diode breakdown level.

3. A circuit for stripping the highest frequency present in a signal wave train having more than one frequency component in accord with claim 2 wherein said non-linear stripping circuit means threshold of clamping is adjustable.

4. A circuit for stripping the highest frequency component producing discrete slope reversals above a preset threshold level from a complex signal wave train having more than one frequency component producing slope reversals comprising capacitive input coupling means, and diode clamped high gain operational amplifier means connected at its input to said capacitive input coupling means and having selected gain and feedback breakdown conduction levels to establish said preset threshold level whereby the output thereof is a square wave indicative of the quantity of slope reversals produced by said highest frequency component above said preset threshold level.

5. A circuit for converting an input signal wave train comprising one or more frequency components of various relative variant amplitudes into a single frequency fixed amplitude wave train whose frequency is the highest frequency present in the incoming wave train that is above a preset threshold level comprising capacitive input coupling means, and clamping feedback diode means connected at its input to said capacitive input coupling and at its output to the output of a high gain negative feedback amplifier means, said preset threshold level being established by the gain of said negative feedback amplifier means and the breakdown conduction levels of said diode means.

6. A circuit in accordance with claim 5 wherein said converting circuit's threshold of converting is adjustable.

7. The method of stripping the highest frequency signal component producing discrete slope reversals above a preset threshold level from a complex signal wave train having more than one frequency component producing slope reversals, comprising the steps of filtering said complex wave train to remove any steady state current therefrom, amplifying the varying current signal remaining after said filtering, and selectively feeding back current of a polarity and magnitude to equalize said varying current signal remaining whereby said highest frequency signal appears as a square wave and all frequency signals below said preset threshold level are eliminated.

* * * * *